United States Patent
Lee et al.

(10) Patent No.: US 8,614,908 B2
(45) Date of Patent: Dec. 24, 2013

(54) BIT LINE SENSE AMPLIFIER LAYOUT ARRAY, LAYOUT METHOD, AND APPARATUS HAVING THE SAME

(75) Inventors: Jae Young Lee, Hwaseong-si (KR);
Jong Hyun Choi, Suwon-si (KR);
Hyang Ja Yang, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 207 days.

(21) Appl. No.: 13/213,508

(22) Filed: Aug. 19, 2011

(65) Prior Publication Data
US 2012/0044734 A1    Feb. 23, 2012

(30) Foreign Application Priority Data
Aug. 20, 2010    (KR) .................. 10-2010-0081061

(51) Int. Cl.
*G11C 5/06*    (2006.01)

(52) U.S. Cl.
USPC ........................... 365/63; 365/205; 365/230.3

(58) Field of Classification Search
USPC ...................................... 365/63, 205, 230.03
See application file for complete search history.

(56) References Cited

U.S. PATENT DOCUMENTS

| | | | |
|---|---|---|---|
| 6,046,950 A | 4/2000 | Kim | |
| 6,538,946 B2 | 3/2003 | Arai et al. | |
| 7,317,646 B2 | 1/2008 | Yoon et al. | |
| 2002/0071324 A1* | 6/2002 | Kitsukawa et al. | ............ 365/200 |
| 2004/0080971 A1* | 4/2004 | Takemura | ........................ 365/63 |

FOREIGN PATENT DOCUMENTS

| | | |
|---|---|---|
| JP | 2002-026294 | 1/2002 |
| KR | 100305031 | 7/2001 |
| KR | 1020020005465 | 1/2002 |
| KR | 100575005 | 4/2006 |

\* cited by examiner

*Primary Examiner* — Hoai V Ho
(74) *Attorney, Agent, or Firm* — F. Chau & Associates, LLC (57) ABSTRACT

A bit line sense amplifier layout array includes N sense amplifier layout regions, which are arranged adjacent each other and have a sense amplifier, respectively. (N+1−i) bit lines and i complementary bit lines are arranged in an $i^{th}$ sense amplifier layout region among the sense amplifier layout regions. An $i^{th}$ bit line among the (N+1−i) bit lines and an $i^{th}$ complementary bit line among the i complementary bit lines are connected to a sense amplifier formed in the $i^{th}$ sense amplifier layout region. The values N and i are natural numbers and i>=1 and <=N.

6 Claims, 11 Drawing Sheets

| | |
|---|---|
| | CSL1B |
| | CSL2B |
| | CSL3B |
| | CSL4B |
| BLSA4 { | PSA4 |
| | PSA4B |
| | EQ4 |
| | NSA4 |
| | NSA4B |
| BLSA3 { | NSA3B |
| | NSA3 |
| | EQ3 |
| | PSA3B |
| | PSA3 |
| BLSA2 { | PSA2 |
| | PSA2B |
| | EQ2 |
| | NSA2 |
| | NSA2B |
| BLSA1 { | NSA1B |
| | NSA1 |
| | EQ1 |
| | PSA1B |
| | PSA1 |
| | CSL4 |
| | CSL3 |
| | CSL2 |
| | CSL1 |

| | |
|---|---|
| | CSL1B |
| | CSL2B |
| | CSL3B |
| | CSL4B |
| BLSA4 { | NSA4 |
| | NSA4B |
| | EQ4 |
| | PSA4 |
| | PSA4B |
| BLSA3 { | PSA3B |
| | PSA3 |
| | EQ3 |
| | NSA3B |
| | NSA3 |
| BLSA2 { | NSA2 |
| | NSA2B |
| | EQ2 |
| | PSA2 |
| | PSA2B |
| BLSA1 { | PSA1B |
| | PSA1 |
| | EQ1 |
| | NSA1B |
| | NSA1 |
| | CSL4 |
| | CSL3 |
| | CSL2 |
| | CSL1 |

BIT LINE SENSE AMPLIFIER LAYOUT ARRAY, LAYOUT METHOD, AND APPARATUS HAVING THE SAME

CROSS-REFERENCE TO RELATED APPLICATIONS

This application claims priority under 35 U.S.C. §119 to Korean Patent Application No. 10-2010-0081061 filed on Aug. 20, 2010, the disclosure of which is incorporated by reference in its entirety herein.

BACKGROUND

Embodiments of the present inventive concept relate to a bit line sense amplifier, and more particularly, to a bit line sense amplifier layout array, a layout method and apparatuses having the array.

In a memory device, data stored in a memory cell can be sensed and amplified by using a bit line sense amplifier. Pitch is a measure of the space in between bit lines connecting adjacent memory cells. The pitch of bit lines of the memory cells is reduced as the size of the memory device is reduced.

However, when the pitch of the bit line has been reduced significantly, it can be difficult to design a layout for a bit line sense amplifier.

SUMMARY

According to an exemplary embodiment of the present inventive concept, a bit line sense amplifier layout array includes N sense amplifier layout regions, which are arranged adjacent each other and have a sense amplifier, respectively. In an $i^{th}(1 \leq i \leq N)$ sense amplifier layout region among the sense amplifier layout regions, (N+1−i) bit lines and i complementary bit lines are arranged. The $i^{th}$ bit line among the (N+1−i) bit lines and an $i^{th}$ complementary bit line among the i complementary bit lines are connected to a sense amplifier formed in the $i^{th}$ sense amplifier layout region. In at least one exemplary embodiment, N is 4.

The $i^{th}$ bit line may be arranged from a first sense amplifier layout region among the sense amplifier layout regions to the $i^{th}$ sense amplifier layout region, and the $i^{th}$ complementary bit line may be arranged from a $N^{th}$ sense amplifier layout region among the sense amplifier layout regions to the $i^{th}$ sense amplifier layout region.

The bit line sense amplifier layout array may be an open bit line type. Each of the bit lines and each of the complementary bit lines may be arranged in zigzag. Each of the N sense amplifier layout regions may be formed in a word line direction.

An exemplary embodiment of the present inventive concept provides a method for manufacturing a bit line sense amplifier layout, including forming N sense amplifier layout regions each lying adjacent each other, forming a sense amplifier in each of the N sense amplifier layout regions, forming (N+1−i) bit lines and i complementary bit lines in an $i(1 \leq i \leq N)^{th}$ sense amplifier layout region among the (1*N) sense amplifier layout regions, and connecting an $i^{th}$ bit line among the (N+1−i) bit lines and an $i^{th}$ complementary bit line among the i complementary bit lines to a sense amplifier formed in the $i^{th}$ sense amplifier layout region.

According to an exemplary embodiment of the present inventive concept, a semiconductor device includes a first memory cell array, a second memory cell array, and a bit line sense amplifier block arranged between the first memory cell array and the second memory cell array.

The bit line sense amplifier block may include a bit line sense amplifier array including N sense amplifier layout regions, which are arranged adjacent each other and have a sense amplifier, respectively. In an $i(1 \leq i \leq N)^{th}$ sense amplifier layout region among the sense amplifier layout regions, (N+1−i) bit lines extended from the first memory cell array and i complementary bit lines extended from the second memory cell array are arranged. An $i^{th}$ bit line among the (N+1−i) bit lines and an $i^{th}$ complementary bit line among the i complementary bit lines are connected to a sense amplifier formed in the $i^{th}$ sense amplifier layout region.

An exemplary embodiment of the present inventive concept is directed to a semiconductor system, including the said semiconductor device and a processor for controlling an operation of the semiconductor device.

The semiconductor system may be embodied in a mobile communication device such as a cellular phone, a smart phone, a laptop computer, a tablet PC, etc.

An exemplary embodiment of the present inventive concept is directed to a memory module, including the said semiconductor device and a semiconductor substrate where the semiconductor device is mounted.

An exemplary embodiment of the present inventive concept is directed to a semiconductor system, including a memory module where the said semiconductor device is mounted, a socket where the memory module may be inserted, and a processor for controlling an operation of the semiconductor device mounted on the memory module through the socket.

The memory module may be a Single In-Line memory module (SIMM) or a Dual In-Line memory module (DIMM). As an example, the semiconductor system may be a personal computer.

According to an exemplary embodiment of the inventive concept, a bit line sense amplifier array includes a plurality of adjacent sense amplifier layout regions, where each region includes a sense amplifier and a plurality of bit lines and a plurality of complementary bit lines. Distinct pairs of the bit lines and complementary bit lines are connected to a sense amplifier of a corresponding one of the regions. A total count of the bit lines located in each region is less than a total count of the bit lines located in a preceding region and a total count of the complementary bit lines located each region is greater than a total count of the bit lines in a preceding region.

One of a bit line and a complementary bit line of a corresponding one of the pairs may include a zigzag shaped part that connects to the corresponding sense amplifier. The regions, the bit lines, and the complimentary bit lines may number 4.

A part of one of the complementary bit lines may be located in the first region adjacent two of the bit lines, and a part of another complementary bit line may be located adjacent only one of the bit lines in the last region. A part of one of the bit lines may be located in the second region adjacent another bit line and a complementary bit line, and another part of the one bit line located in the third region may be adjacent the complementary bit line and another complementary bit line.

BRIEF DESCRIPTION OF THE DRAWINGS

The present inventive concept will become apparent and more readily appreciated from the following description of the exemplary embodiments, taken in conjunction with the accompanying drawings of which.

DETAILED DESCRIPTION

Reference will now be made in detail to exemplary embodiments of the present inventive concept, examples of which are illustrated in the accompanying drawings, wherein like reference numerals refer to like elements throughout.

Figure 1:
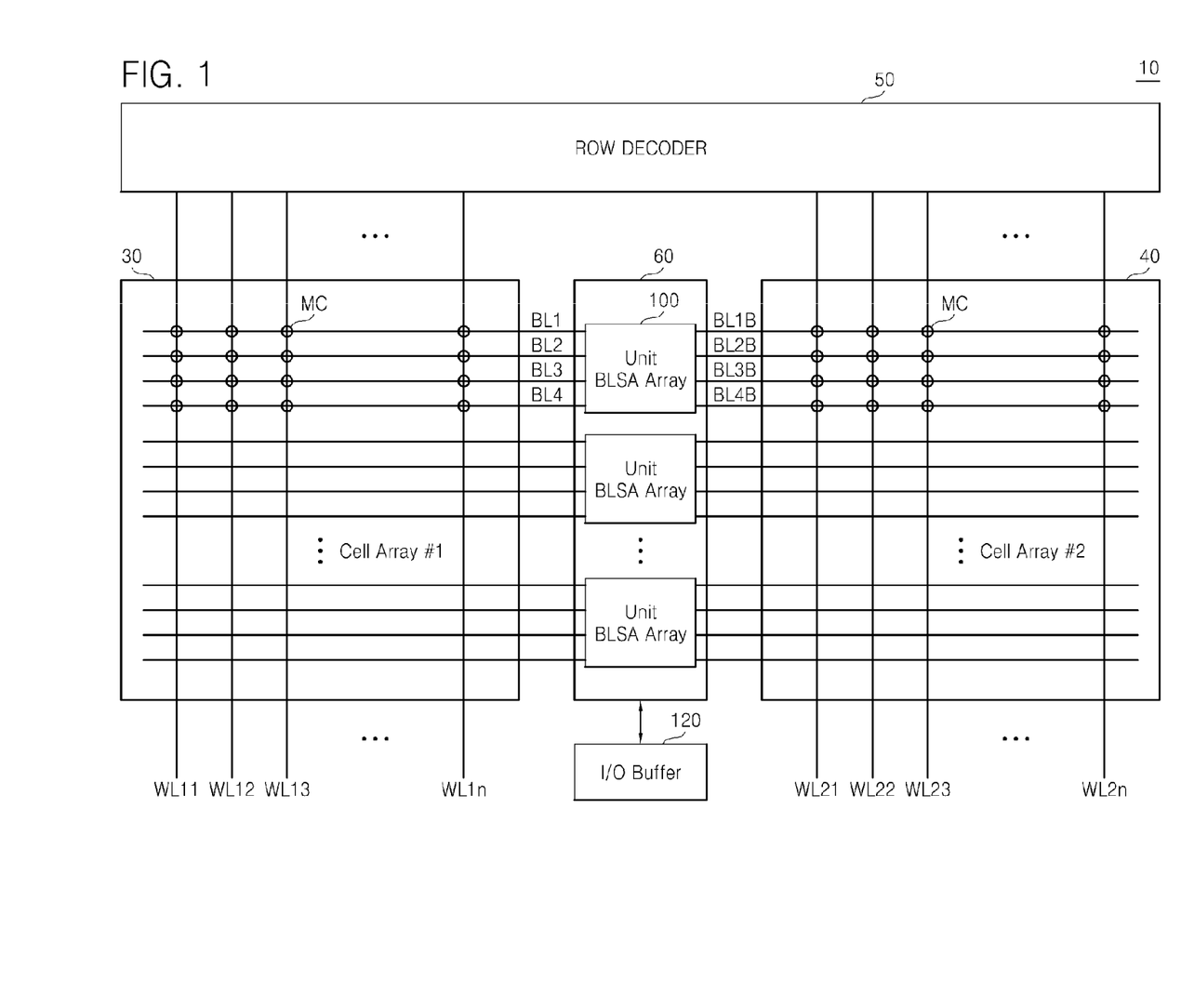
FIG. 1 shows a block diagram of a memory device including a bit line sense amplifier layout array according to an exemplary embodiment of the inventive concept.
Figure 2:
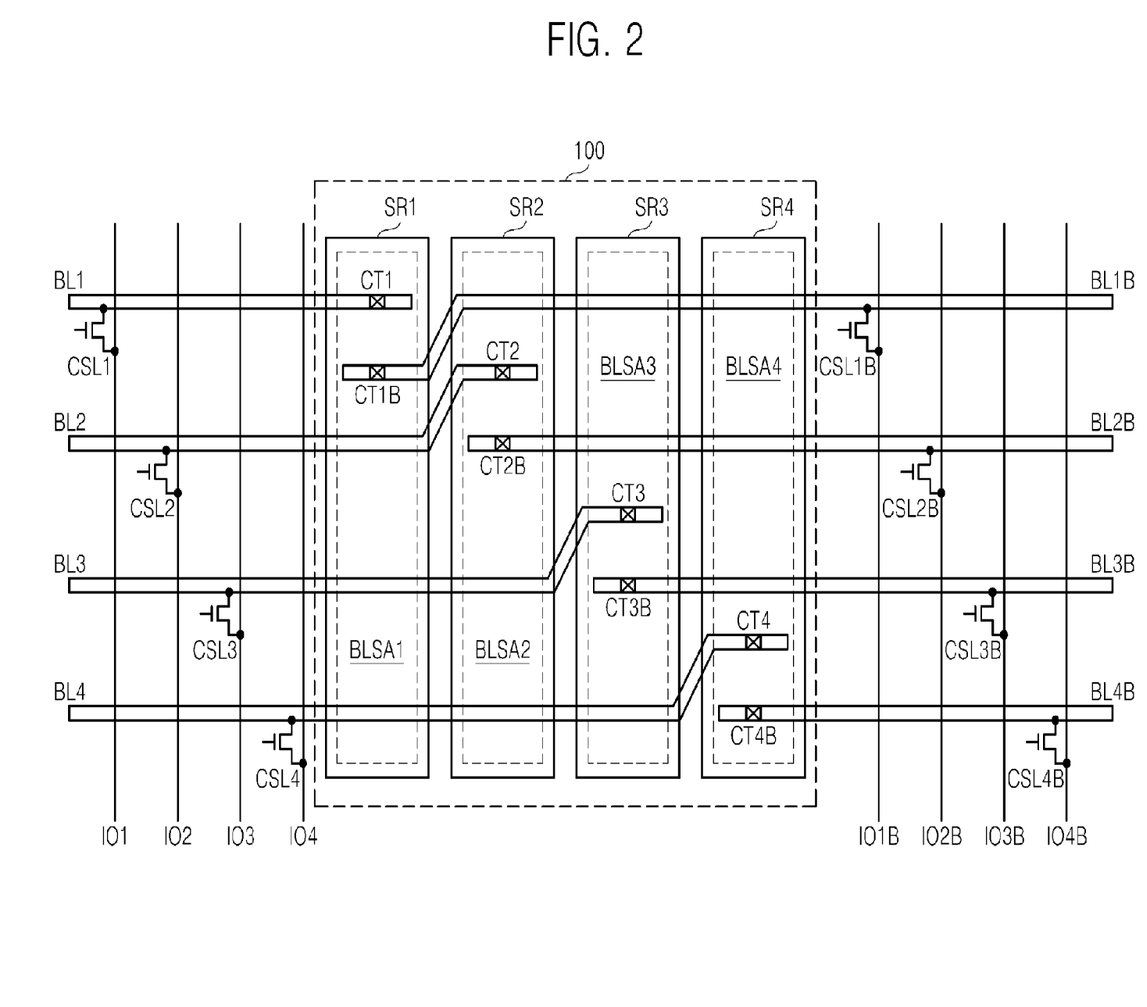
FIG. 2 shows layout patterns of the bit line sense amplifier array illustrated in FIG. 1 according to an exemplary embodiment of the inventive concept.

FIG. 1 shows a block diagram of a memory device including a bit line sense amplifier layout array according to an exemplary embodiment of the inventive concept, and FIG. 2 shows layout patterns of the bit line sense amplifier array illustrated in FIG. 1 according to an exemplary embodiment of the inventive concept.

Referring to FIGS. 1 and 2, the memory device 10 includes a plurality of memory cell arrays 30 and 40, a row decoder 50, a bit line sense amplifier block 60, and an input/output buffer 120.

The bit line sense amplifier layout array 100 according to an exemplary embodiment of the present inventive concept may be applied to a volatile memory device or a non-volatile memory device. The array 100 may be applied to memory devices, which use an open bit line sense amplification scheme.

For convenience of explanation, a layout of four bit lines BL1 to BL4 and four complementary bit lines BL1B to BL4B is discussed below with reference to FIGS. 1 and 2.

The first memory cell array 30 includes a plurality of memory cells MC each connected to each of a plurality of word lines WL11 to WL1n and each of a plurality of bit lines.

The second memory cell array 40 includes a plurality of memory cells MC each connected to a plurality of word lines WL21 to WL2n and a plurality of bit lines.

The row decoder 50 may decode row addresses and drive at least one of a plurality of the word lines WL11 to WL1n of the first memory cell array 30 selectively according to a decoding result.

Further, the row decoder 50 may decode row addresses and drive at least one of a plurality of word lines WL21 to WL2n of the second memory cell array 40 selectively according to a decoding result.

The bit line sense amplifier block 60 is located between the first memory cell array 30 and the second memory cell array 40. The bit line sense amplifier block 60 includes a plurality of bit line sense amplifier layout arrays 100.

During a read operation, the input/output buffer 120 outputs read data output from the bit line sense amplifier block 60 to an input/output data bus.

Referring to FIGS. 1 and 2 again, since each unit bit line sense amplifier layout array (Unit BLSA Array) has the same structure, only an operation of a first bit line sense amplifier array 100 is discussed below.

The bit line sense amplifier layout array 100 includes (1*N) bit line sense amplifier layout regions SR1 to SR4 each arranged adjacently in the same direction. It is assumed that N is 4 in the following example merely for ease of discussion. For example, in alternate embodiments of the present inventive concept, N may be less than 4 or greater than 4.

Each of the bit line sense amplifier layout regions SR1 to SR4 includes a corresponding one of sense amplifiers BLSA1 to BLSA4. A circuit that forms each of the sense amplifiers BLSA1 to BLSA4 may be modified variously. Each of the sense amplifiers BLSA1 to BLSA4 is connected to a pair of corresponding bit lines (e.g., a bit line and a complementary bit line).

In the first sense amplifier layout region SR1, a first bit line BL1, a first complementary bit line BL1B, a second bit line BL2, a third bit line BL3, and a fourth bit line BL4 are arranged. For example, part of the bit line BL1, part of the first complementary bit line BL1B, part of the second bit line BL2, part of the third bit line BL3, and part of the fourth bit line BL4 may be located within region SR1.

The first bit line BL1 is connected to one of two nodes of a first sense amplifier BLSA1 through a first contact CT1, and a first complementary bit line BL1B is connected to the other of the two nodes of the first sense amplifier BLSA1 through a second contact CT1B. Accordingly, during a sense amplification operation, the first sense amplifier BLSA1 may sense and amplify a voltage difference between the first bit line BL1 and the first complementary bit line BL1B.

In the second sense amplifier layout region SR2, a first complementary bit line BL1B, a second bit line BL2, a second complementary bit line BL2B, a third bit line BL3, and a fourth bit line BL4 are arranged. For example, part of the first complementary bit line BL1B, part of the second bit line BL2, part of the second complementary bit line BL2B, part of the third bit line BL3, and part of the fourth bit line BL4 may be located within the region SR2.

The second bit line BL2 is connected to one of two nodes of a second sense amplifier BLSA2 through a third contact CT2, and a second complementary bit line BL2B is connected to the other of the two nodes of the second sense amplifier BLSA2 through a fourth contact CT2B. Accordingly, during a sense amplification operation, the second sense amplifier BLSA2 may sense and amplify a voltage difference between the second bit line BL2 and the second complementary bit line BL2B.

In the third sense amplifier layout region SR3, a first complementary bit line BL1B, a second complementary bit line BL2B, a third bit line BL3, a third complementary bit line BL3B, and a fourth bit line BL4 are arranged. For example, part of the first complementary bit line BL1B, part of the second complementary bit line BL2B, part of the third bit line BL3, part of the third complementary bit line BL3B, and part of the fourth bit line BL4 may be located within the SR3 region.

The third bit line BL3 is connected to one of two nodes of a third sense amplifier BLSA3 through a fifth contact CT3, and a third complementary bit line BL3B is connected to the other of the two nodes of the third sense amplifier BLSA3 through a sixth contact CT3B. Accordingly, during a sense amplification operation, the third sense amplifier BLSA3 may sense and amplify a voltage difference between the third bit line BL3 and the third complementary bit line BL3B.

In the fourth sense amplifier layout region SR4, a first complementary bit line BL1B, a second complementary bit line BL2B, a third complementary bit line BL3B, a fourth bit line BL4, and a fourth complementary bit line BL4B are arranged. For example, part of the first complementary bit line BL1B, part of the second complementary bit line BL2B, part of the third complementary bit line BL3B, part of the fourth bit line BL4, and part of the fourth complementary bit line BL4B may be located within the SR4 region.

The fourth bit line BL4 is connected to one of two nodes of a fourth sense amplifier BLSA4 through a seventh contact CT4, and a fourth complementary bit line BL4B is connected to the other of the two nodes of the fourth sense amplifier BLSA4 through an eighth contact CT4B. Accordingly, during a sense amplification operation, the fourth sense amplifier BLSA4 may sense and amplify a voltage difference between the fourth bit line BL4 and the fourth complementary bit line BL4B.

For example, the sense amplifier layout array 100 includes 4 sense amplifier layout regions SR1 to SR4, which are arranged adjacent each other and include each sense amplifier BLSA1 to BLSA4, respectively when N is 4.

In an $i(1 \leq i \leq 4)^{th}$ sense amplifier layout region among sense amplifier layout regions SR1 to SR4, (5−i) bit lines and i complementary bit line(s) are arranged, and an $i^{th}$ bit line among the (5−i) bit lines and an $i^{th}$ complementary bit line among the i complementary bit lines are connected to a sense amplifier formed in the $i^{th}$ sense amplifier layout region.

The first bit line BL1 is for transmitting data of a first memory cell in a first memory cell array 30 from the first memory cell array 30 to the first sense amplifier layout region SR1. The first complementary bit line BL1B is for transmitting data of a second memory cell in a second memory cell array 40 from the second memory cell array 40 to the first sense amplifier layout region SR1.

The second bit line BL2 is for transmitting data of a third memory cell in the first memory cell array 30 from the first memory cell array 30 to the second sense amplifier layout region SR2. The second complementary bit line BL2B is for transmitting data of a fourth memory cell in the second memory cell array 40 from the second memory cell array 40 to the second sense amplifier layout region SR2.

The third bit line BL3 is for transmitting data of a fifth memory cell in the first memory cell array 30 from the first memory cell array 30 to the third sense amplifier layout region SR3. The third complementary bit line BL3B is for transmitting data of a sixth memory cell in a second memory cell array 40 from the second memory cell array 40 to the third sense amplifier layout region SR3.

The fourth bit line BL4 is for transmitting data of a seventh memory cell in the first memory cell array 30 from the first memory cell array 30 to the fourth sense amplifier layout region SR4. The fourth complementary bit line BL4B is for transmitting data of an eighth memory cell in the second memory cell array 40 from the second memory cell array 40 to the fourth sense amplifier layout region SR4.

Pairs of a corresponding bit line and complementary bit line BL1 and BL1B, BL2 and BL2B, BL3 and BL3B and BL4 and BL4B may be arranged in a zigzag pattern.

Referring to FIG. 2, when four sense amplifier layout regions SR1 to SR4 are included in the sense amplifier layout array 100, a sum of the number of bit lines and complementary bit lines included in each of the four sense amplifier layout regions SR1 to SR4 is 5. For example, a sense amplifier layout region includes portions of bit lines and complementary bit lines that sum to 5 when there are 4 such regions.

By layout of a bit line and a complementary bit line as illustrated in FIG. 2, bit line sense amplifiers may be constructed even though pitch of a memory cell and a bit line or a complementary bit line decreases.

As shown in FIG. 2, selection transistors may transmit a voltage of a corresponding one of bit lines BL1, BL2, BL3, BL4, BL1B, BL2B, BL3B or BL4B to a corresponding one of data input/output lines IO1, IO2, IO3, IO4, IO1B, IO2B, IO3B and IO4B in response to a corresponding one of selection signals CSL1, CSL2, CSL3, CSL4, CSL1B, CSL2B, CSL3B and CSL4B.

Figure 3:
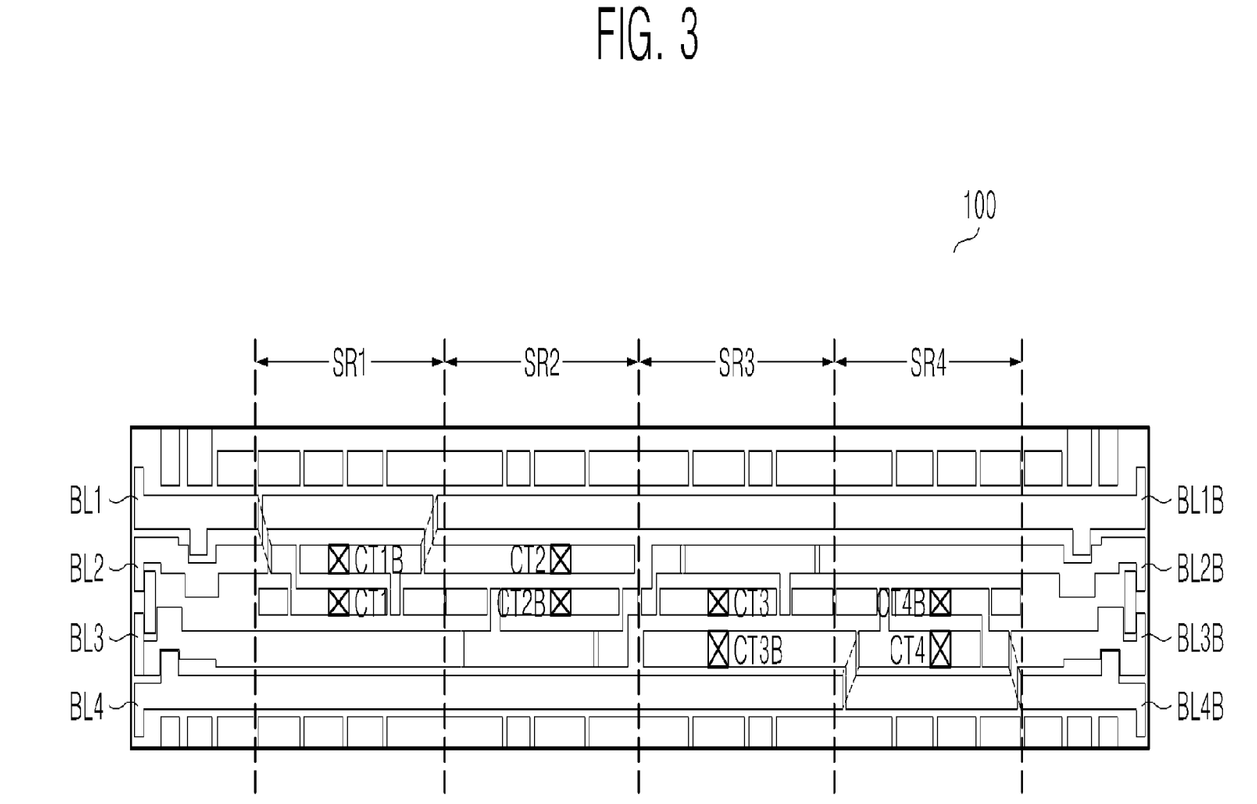
FIG. 3 shows a detailed diagram of layout patterns of the bit line sense amplifier array illustrated in FIG. 2 according to an exemplary embodiment of the inventive concept.

FIG. 3 shows a detailed diagram of layout patterns of the bit line sense amplifier array illustrated in FIG. 2 according to an exemplary embodiment of the inventive concept. Referring to FIGS. 2 and 3, a solid line in FIG. 3 means a metal pattern is formed on the same layer and a dotted line means a metal pattern connects different layers to each other. The metal pattern formed to connect different layers to each other may be accomplished using an electrical connection means (e.g., a via, a through silicon via (TSV), a jumper, etc.). For example, a TSV is a vertical electrical connection that passes completely through a silicon wafer or die.

In the first sense amplifier layout region SR1, a first bit line BL1, a first complementary bit line BL1B, a second bit line BL2, a third bit line BL3 and a fourth bit line BL4 are arranged. The first bit line BL1 is connected to one of two nodes of a first sense amplifier BLSA1 through a first contact CT1, and a first complementary bit line BL1B is connected to the other of the two nodes of the first sense amplifier BLSA1 through a second contact CT1B.

In the second sense amplifier layout region SR2, a first complementary bit line BL1B, a second bit line BL2, a second complementary bit line BL2B, a third bit line BL3 and a fourth bit line BL4 are arranged. The second bit line BL2 is connected to one of two nodes of a second sense amplifier BLSA2 through a third contact CT2, and a second complementary bit line BL2B is connected to the other of the two nodes of the second sense amplifier BLSA2 through a fourth contact CT2B.

In the third sense amplifier layout region SR3, a first complementary bit line BL1B, a second complementary bit line BL2B, a third bit line BL3, a third complementary bit line BL3B and a fourth bit line BL4 are arranged. The third bit line BL3 is connected to one of two nodes of a third sense amplifier BLSA3 through a fifth contact CT3, and a third complementary bit line BL3B is connected to the other of the two nodes of the third sense amplifier BLSA3 through a sixth contact CT3B.

In the fourth sense amplifier layout region SR4, a first complementary bit line BL1B, a second complementary bit line BL2B, a third complementary bit line BL3B, a fourth bit line BL4 and a fourth complementary bit line BL4B are arranged. The fourth bit line BL4 is connected to one of two nodes of a fourth sense amplifier BLSA4 through a seventh contact CT4, and a fourth complementary bit line BL4B is connected to the other of the two nodes of the fourth sense amplifier BLSA4 through an eighth contact CT4B.

Figure 4:
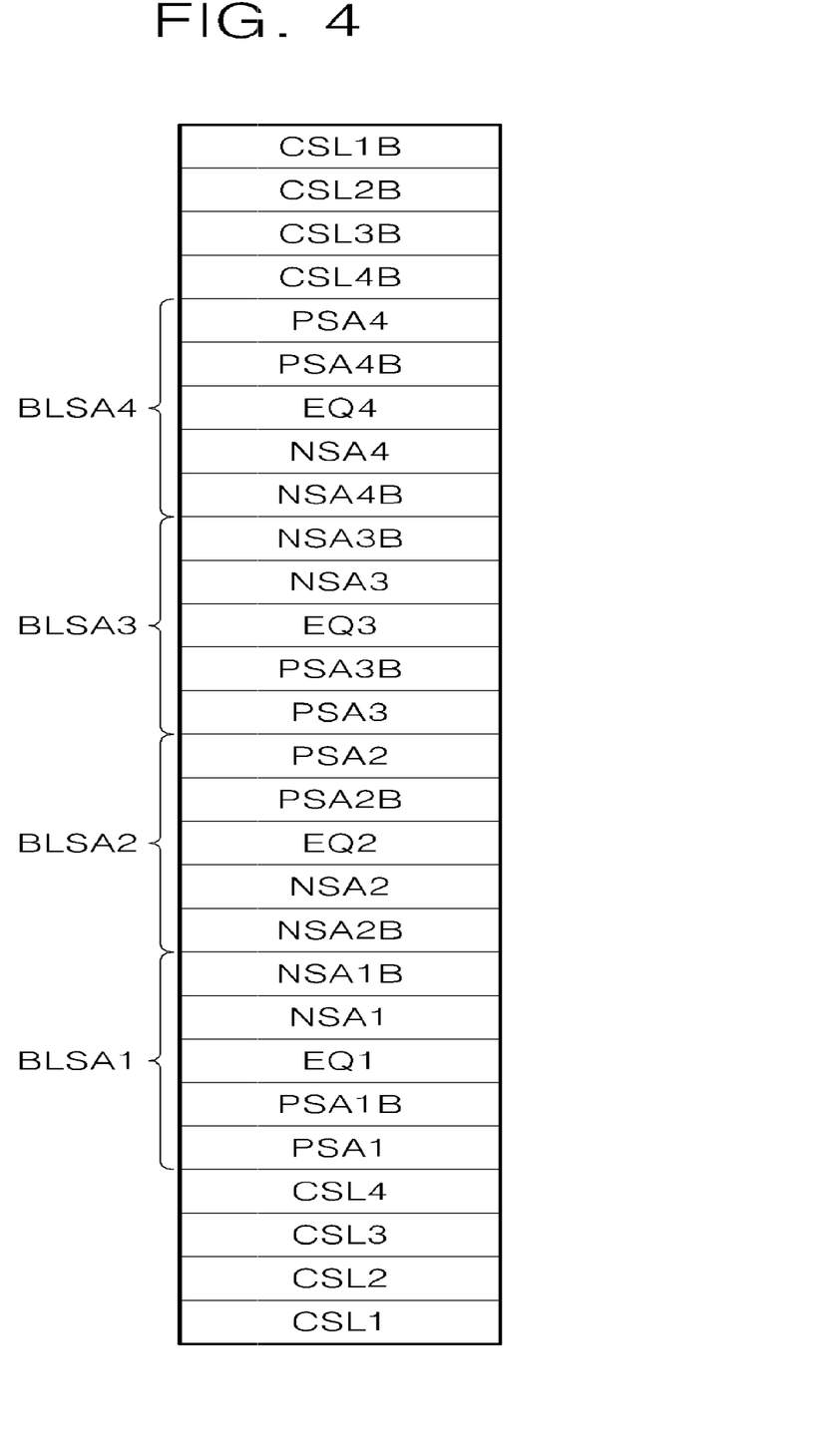
FIG. 4 shows a plurality of bit line sense amplifiers arranged in a layout of the bit line sense amplifier array illustrated in FIG. 2 according to an exemplary embodiment of the inventive concept.
Figure 5:
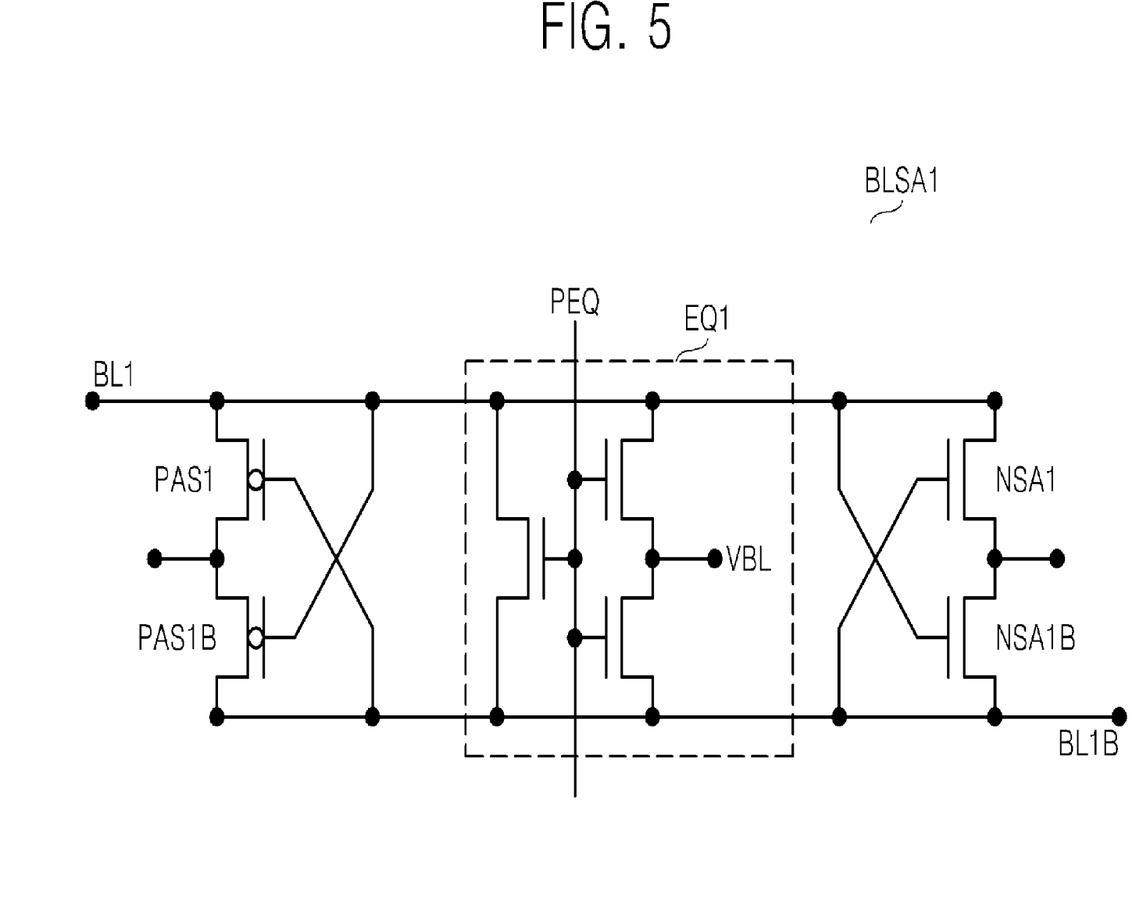
FIG. 5 shows a circuit diagram of a bit line sense amplifier illustrated in FIG. 4 according to an exemplary embodiment of the inventive concept.

FIG. 4 shows an exemplary embodiment where a plurality of bit line sense amplifiers are arranged in the bit line sense amplifier array layout illustrated in FIG. 2, and FIG. 5 shows a circuit diagram of a first bit line sense amplifier BLSA1 illustrated in FIG. 4 according to an exemplary embodiment of the inventive concept.

Referring to FIGS. 2 to 5, a first sense amplifier BLSA1 is arranged in a first sense amplifier layout region SR1. Internal circuits of the first sense amplifier BLSA1 include a first sensing unit PSA1 and PSA1B, an equalizer EQ1, and a second sensing unit NSA1B and NSA1. The first sensing unit PSA1 and PSA1B, the equalizer EQ1, and the second sensing unit NSA1B and NSA1 may be arranged sequentially within the first sense amplifier BLSA1.

In the second sense amplifier layout region SR2, a second sense amplifier BLSA2 is arranged. Internal circuits of the second sense amplifier BLSA2 include a second sensing unit NSA2B and NSA2, an equalizer EQ2, and a first sensing unit PSA2B and PSA2. The second sensing unit NSA2B and NSA2, the equalizer EQ2, and the first sensing unit PSA2B and PSA2 may be arranged sequentially within the second sense amplifier BLSA2.

In the third sense amplifier layout region SR3, a third sense amplifier BLSA3 is arranged. Internal circuits of the third sense amplifier BLSA3 include a first sensing unit PSA3 and PSA3B, an equalizer EQ3, and a second sensing unit NSA3 and NSA3B. The first sensing unit PSA3 and PSA3B, the equalizer EQ3, and a second sensing unit NSA3 and NSA3B may be arranged sequentially within the third sense amplifier BLSA3.

In the fourth sense amplifier layout region SR4, a fourth sense amplifier BLSA4 is arranged. Internal circuits of the fourth sense amplifier BLSA4 include a second sensing unit NSA4B and NSA4, an equalizer EQ4, and a first sensing unit PSA4B and PSA4. The second sensing unit NSA4B and NSA4, the equalizer EQ4, and the first sensing unit PSA4B and PSA4 may be arranged sequentially within the fourth sense amplifier BLSA4.

Since the bit line sense amplifiers BLSA1, BLSA2, BLSA3 and BLSA4 have substantially the same structure, respectively, only a first sense amplifier BLSA1 is illustrated in FIG. 5 for convenience of explanation.

Referring to FIG. 5 again, a first sense amplifier BLSA1 includes a first sensing unit PSA1 and PSA1B, an equalizer EQ1 and a second sensing unit NSA1 and NSA1B.

According to an exemplary embodiment of the inventive concept, the first sensing unit PSA1 and PSA1B includes a pair of PMOS transistors and the second sensing unit NSA1 and NSA1B includes a pair of NMOS transistors.

The equalizer EQ1 pre-charges a first bit line BL1 and a first complementary bit line BL1B with a pre-charge voltage VBL in response to an equalizing signal PEQ.

In FIG. 5, the equalizer EQ1 is arranged between the first sensing unit PSA1 and PSA1B and the second sensing unit NSA1 and NSA1B. However, in alternate embodiments, the equalizer EQ1 may be arranged at the left end of the first sensing unit PSA1 and PSA1B or at the right side of the second sensing unit NSA1 and NSA1B. For example, the equalizer EQ1 may be located to the left of the first sensing unit PSA1 and PSA1B or to the right of the second sensing unit NSA1B and NSA1.

Figure 6:
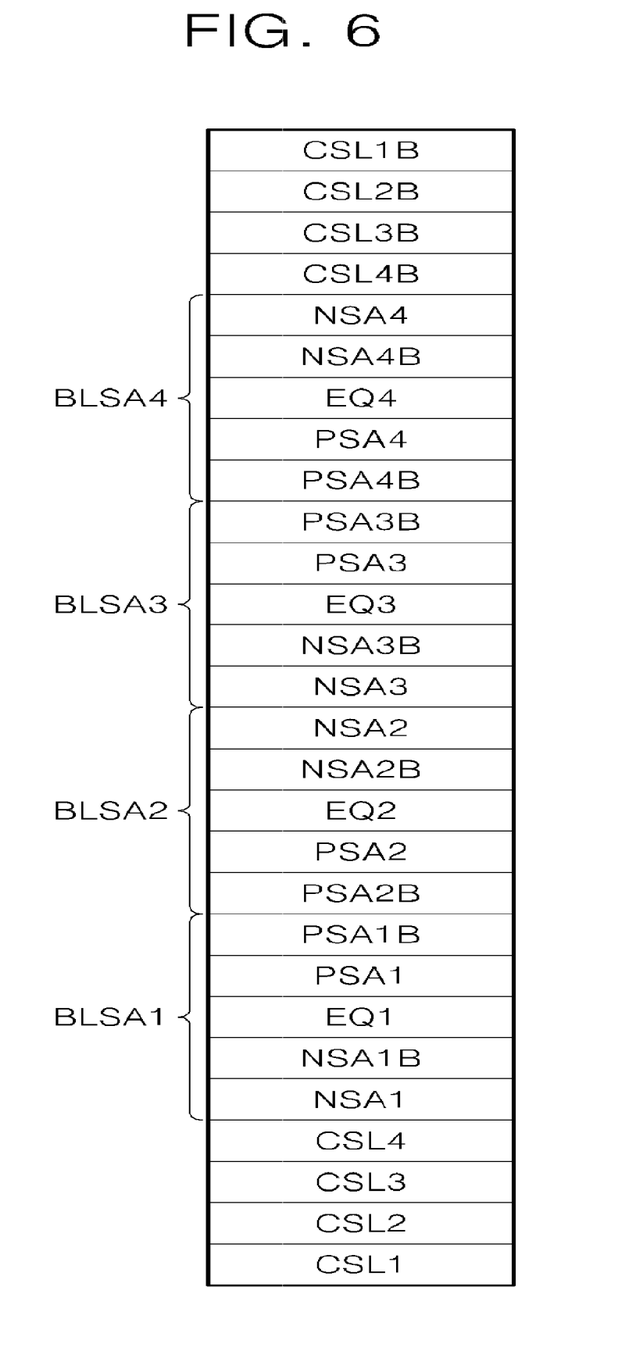
FIG. 6 shows a plurality of bit line sense amplifiers arranged in a layout of the bit line sense amplifier array illustrated in FIG. 2 according to an exemplary embodiment of the inventive concept.

FIG. 6 shows an embodiment where a plurality of bit line sense amplifiers are arranged in a layout of the bit line sense amplifier array illustrated in FIG. 2.

Referring to FIGS. 2, 3, and 6, a first sense amplifier BLSA1 is arranged in a first sense amplifier layout region SR1. Internal circuits of the first sense amplifier BLSA1 are arranged in order of a second sensing unit NSA1 and NSA1B, an equalizer EQ1 and a first sensing unit PSA1 and PSA1B.

In the second sense amplifier layout region SR2, a second sense amplifier BLSA2 is arranged. Internal circuits of the second sense amplifier BLSA2 are arranged in order of a first sensing unit PSA2B and PSA2, an equalizer EQ2 and a second sensing unit NSA2B and NSA2.

In the third sense amplifier layout region SR3, a third sense amplifier BLSA3 is arranged. Internal circuits of the third sense amplifier BLSA3 are arranged in order of a second sensing unit NSA3 and NSA3B, an equalizer EQ3 and a first sensing unit PSA3 and PSA3B.

In the fourth sense amplifier layout region SR4, a fourth sense amplifier BLSA4 is arranged. Internal circuits of the fourth sense amplifier BLSA4 are arranged in order of a first sensing unit PSA4B and PSA4, an equalizer EQ4 and a second sensing unit NSA4B and NSA4.

The structure of the other bit line sense amplifiers BLSA2, BLSA3 and BLSA4 may be the same as described above for the first bit line sense amplifier BLSA1 shown in FIG. 5.

Figure 7:
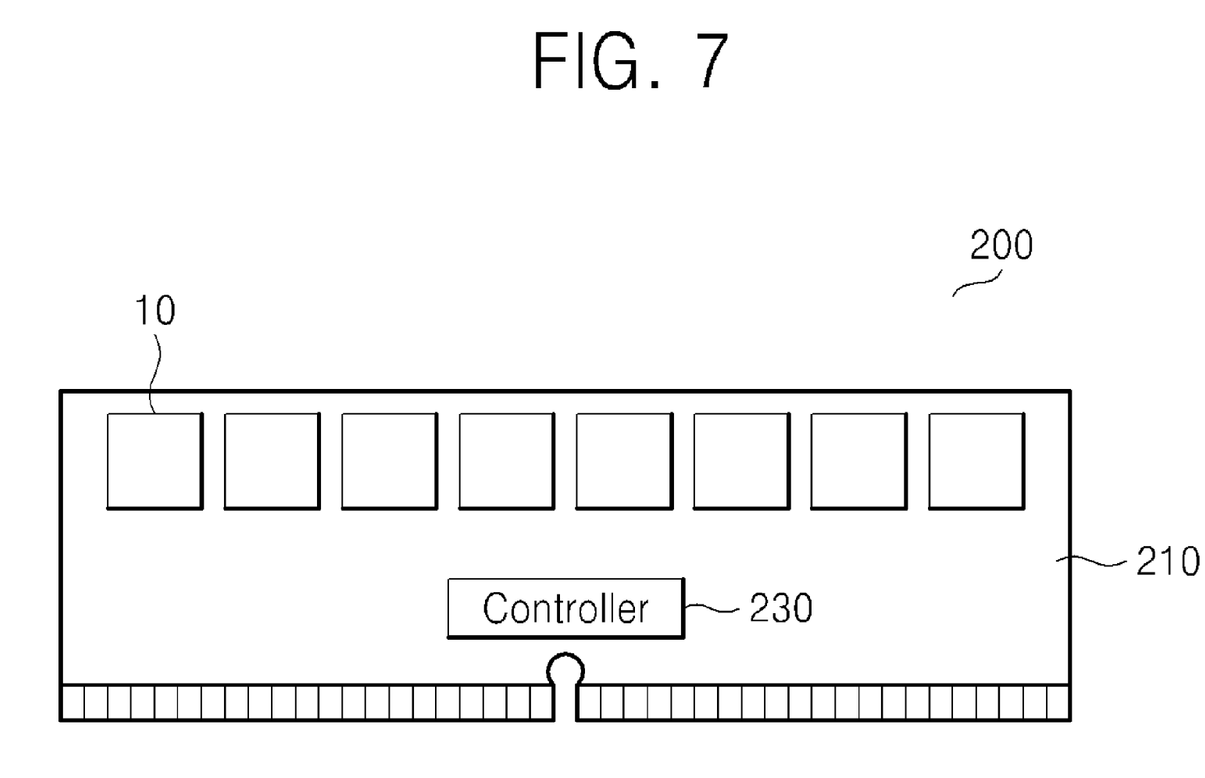
FIG. 7 shows an exemplary memory module including a memory device illustrated in FIG. 1.

FIG. 7 shows a memory module including a memory device illustrated in FIG. 1 according to an exemplary embodiment of the inventive concept.

Referring to FIG. 7, a memory module 200 includes a semiconductor substrate 210 and a plurality of memory devices 10 mounted on the semiconductor substrate 210.

The structure and operation of the plurality of memory devices 10 is substantially the same as a structure and an operation of the semiconductor memory device 10 described above with reference to FIGS. 1 to 3.

The memory module 200 may further include a controller 230 for controlling operations of the plurality of memory devices 10.

The memory module 200 may be embodied in a Single In-Line Memory Module (SIMM) or a Dual In-Line Memory Module (DIMM).

Figure 8:
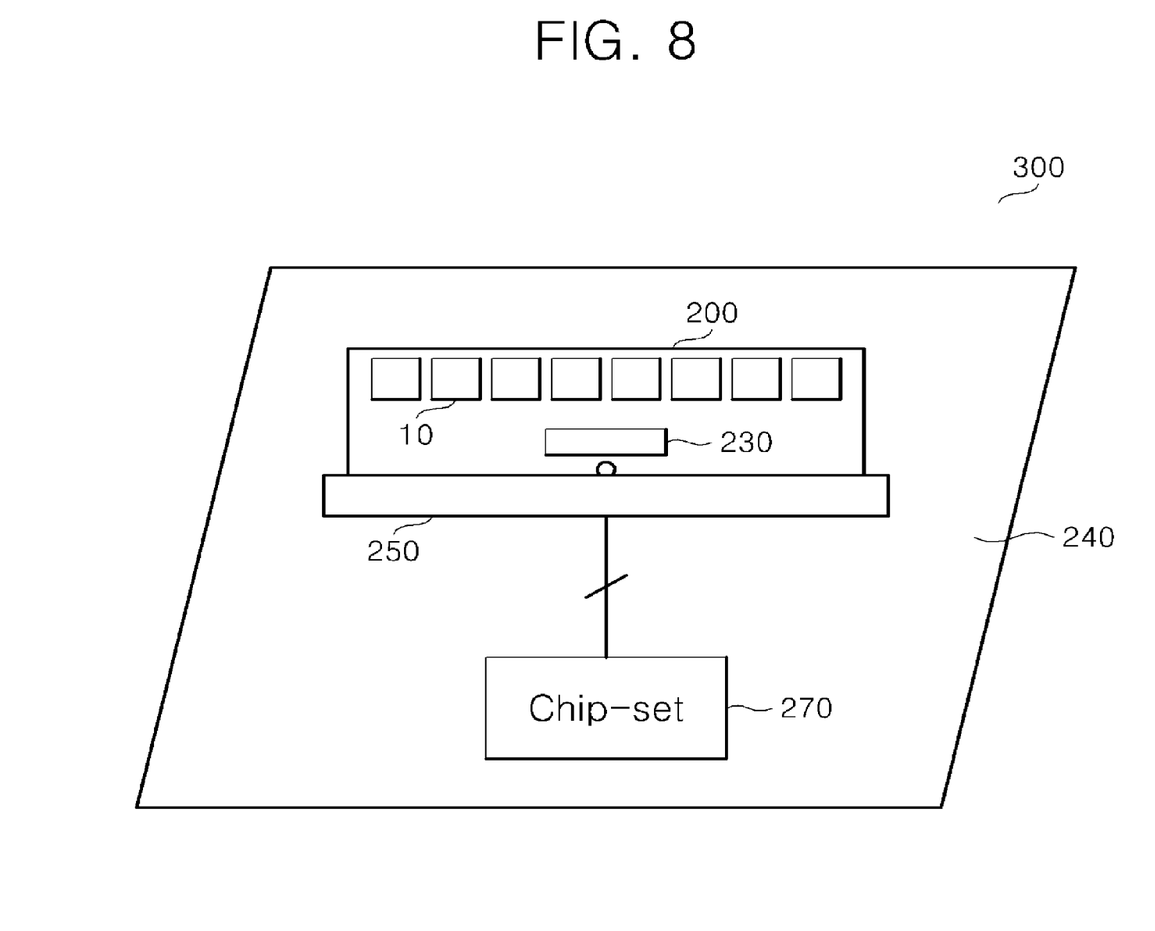
FIG. 8 shows a block diagram of an exemplary memory system including the memory module illustrated in FIG. 7.

FIG. 8 shows a block diagram of a memory system 300 including the memory module 10 illustrated in FIG. 7 according to an exemplary embodiment of the inventive concept. The memory system 300 may be included in a computer system. The memory system 300 includes a main board 240, a slot 250 mounted on the main board 240, a memory module 200 and a processor 270 (e.g., a chip-set), which may control operations of the plurality of memory devices 10. The memory module 200 may be inserted into the slot 250.

The chip set 270 may transmit or receive data to/from each of the plurality of memory devices 10 through a data bus. As an example, the memory system 300 may be included in a personal computer (PC), a tablet PC, a laptop computer, etc.

Figure 9:
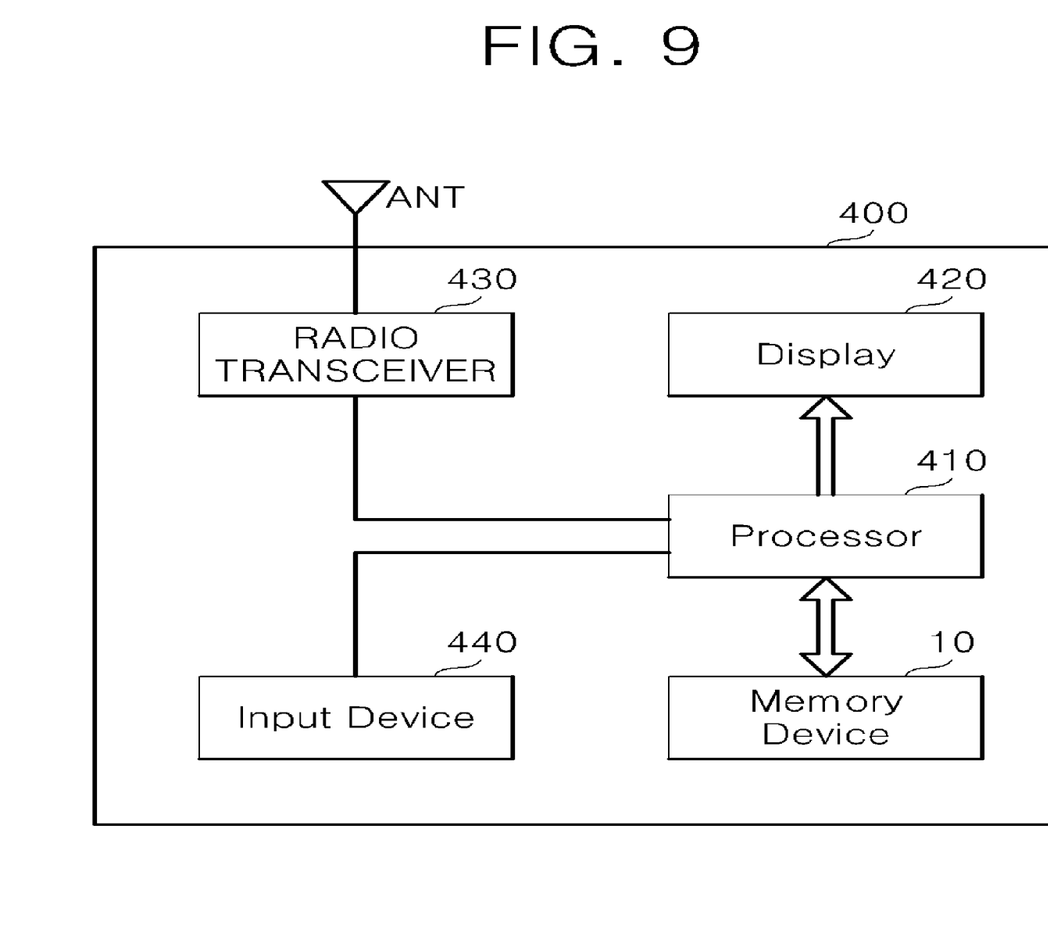
FIG. 9 shows an exemplary embodiment of a memory system including the memory device illustrated in FIG. 1.

FIG. 9 shows an exemplary embodiment of a memory system 400 including a memory device illustrated in FIG. 1. Referring to FIG. 9, the memory system 400 includes a memory device 10 and a processor 410 controlling a data processing operation of the memory device 10. As an example, the memory system 400 may be included in a cellular phone, a smart phone, a wireless internet device, etc.

Data stored in the memory device 10 may be displayed through a display 420 under a control of the processor 410.

A wireless transceiver 430 may transmit or receive wireless signals through an antenna ANT. For example, the wireless transceiver 430 may change wireless signals received through the antenna ANT into signals, which the processor 410 may process. Accordingly, the processor 410 may process signals output from the wireless transceiver 430 and store processed signals in the memory device 10 or display them through a display 420. In addition, the wireless transceiver 430 may convert signals output from the processor 410 into wireless signals and output the wireless signals through the antenna ANT.

An input device 440 may input control signals for controlling an operation of the processor 410 or data to be processed by the processor 410. As an example, the input device may be a pointing device such as a touch pad or a computer mouse, a keypad, a keyboard, etc.

The processor 410 may control an operation of the display 420 so that data output from the memory device 10, the wireless transceiver 430 or the input device 440 may be displayed through the display 420.

Figure 10:
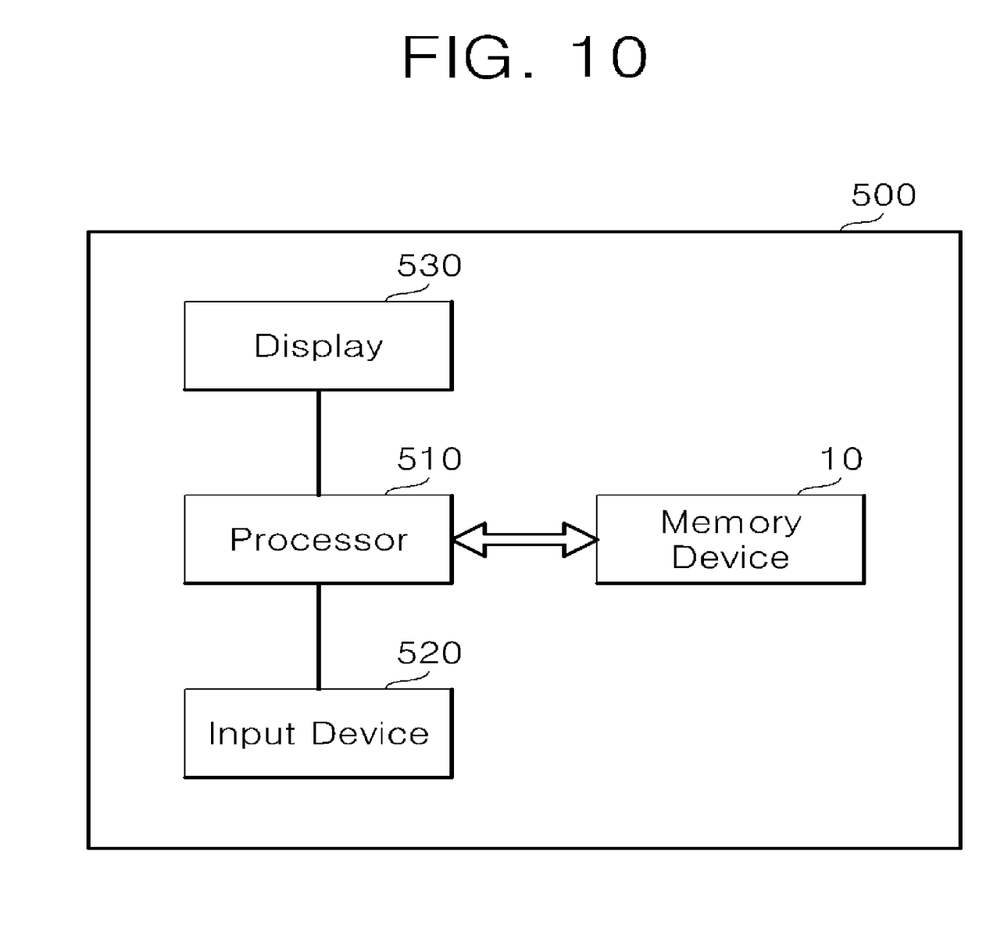
FIG. 10 shows an exemplary embodiment of a memory system including the memory device illustrated in FIG. 1.

FIG. 10 shows an exemplary embodiment of a memory system 500 including a memory device illustrated in FIG. 1. Referring to FIG. 10, the memory system 500 includes a memory device 10 and a processor 510 controlling a data processing operation of the memory device 10. As an example, the memory system 500 may be included in data processing device such as a tablet computer, a net-book, an e-reader, a personal digital assistant (PDA), a portable multimedia player (PMP), a MP3 player or a MP4 player, etc.

The processor 510 may display data stored in the memory device 10 through a display 530 according to an input signal input by an input device 520. For example, the input device 520 may be a pointing device such as a touch pad or a computer mouse, a keypad, a keyboard, etc.

Figure 11:
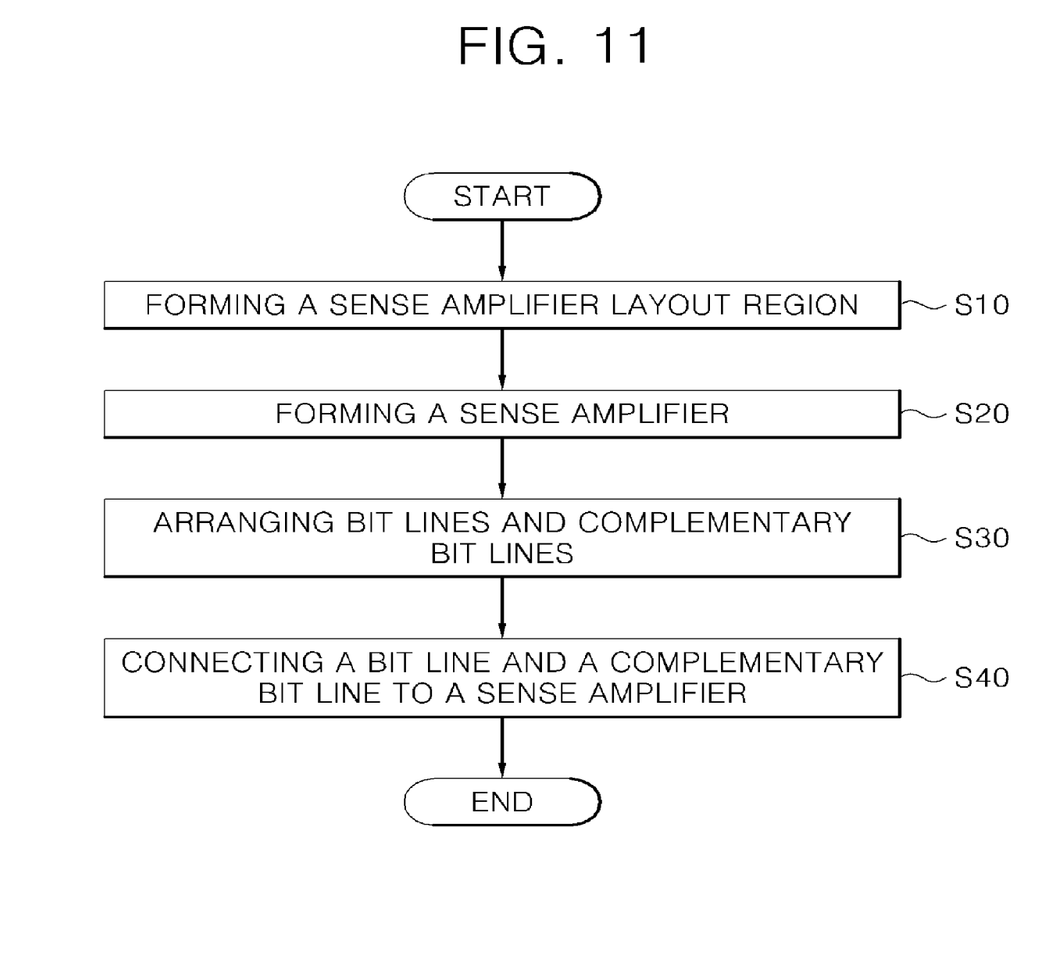
FIG. 11 is a flowchart for a method of manufacturing a bit line sense amplifier layout according to an exemplary embodiment of the inventive concept.

FIG. 11 is a flowchart for a method of manufacturing a bit line sense amplifier layout illustrated in FIG. 1. Referring to FIGS. 1 to 3, and 11, the method for forming a sense amplifier layout array 100 is discussed below.

The method includes forming (1*N) neighboring sense amplifier layout regions SR1 to SR4 on a semiconductor substrate (S10) and forming a sense amplifier in each of the (1*N) sense amplifier layout regions SR1 to SR4 (S20).

The method further includes forming (N+1-i) bit lines and i complementary bit lines in an i(1≤i≤N)$^{th}$ sense amplifier layout region among the (1*N) sense amplifier layout regions SR1 to SR4 (S30).

An i$^{th}$ bit line among the (N+1-i) bit lines and an i$^{th}$ complementary bit line among the i complementary bit lines are connected to a sense amplifier formed in the i$^{th}$ sense amplifier layout region by contact, respectively. Each of the (N+1-i) bit lines and each of the i complementary bit lines may be arranged in a zigzag pattern.

Even though memory cell pitch and bit line pitch have been severely reduced, at least one embodiment of the inventive concept enables a bit line sense amplifier layout array to be constructed.

While exemplary embodiments of the present inventive concept have been shown and described, it will be appreciated that various changes may be made in these embodiments without departing from the spirit and scope of the inventive concept.

What is claimed is:

1. A bit line sense amplifier array comprising:
   a plurality of adjacent sense amplifier layout regions, where each region includes a sense amplifier; and
   a plurality of bit lines and a plurality of complementary bit lines, wherein distinct pairs of the bit lines and complementary bit lines are connected to a sense amplifier of a corresponding one of the regions, wherein a total count of the bit lines located in each region is less than a total count of the bit lines located in a preceding region and a total count of the complementary bit lines located in each region is greater than a total count of the bit lines located in a preceding region.

2. The bit line sense amplifier array of claim 1, wherein one of a bit line and a complementary bit line of a corresponding one of the pairs includes a zigzag shaped part that connects to the corresponding sense amplifier.

3. The bit line sense amplifier array of claim 1, wherein the regions number 4, the bit lines number 4, and the complimentary bit lines number 4.

4. The bit line sense amplifier array of claim 3, wherein a part of one of the complementary bit lines is located in the first region adjacent two of the bit lines, and a part of another complementary bit line is located adjacent only one of the bit lines in the last region.

5. The bit line sense amplifier array of claim 3, wherein a part of one of the bit lines is located in the second region adjacent another bit line and a complementary bit line, and another part of the one bit line located in the third region is adjacent the complementary bit line and another complementary bit line.

6. The bit line sense amplifier array of claim 1, further comprising:
   a plurality of first transistors;
   a plurality of second transistors;
   a plurality of input/output lines arranged adjacent the first layout region and crossing the bit lines; and
   a plurality of complementary input/output lines arranged adjacent the last layout region and crossing the complementary bit lines,
   wherein each of the first transistors is connected to a corresponding distinct pair of the bit lines and input/output lines, and
   wherein each of the second transistors is connected to a corresponding distinct pair of the complementary bit lines and the complementary input/output lines.

* * * * *